United States Patent [19]

Parrier et al.

[11] 4,099,215
[45] Jul. 4, 1978

[54] SECURITY APPARATUS FOR THE PROTECTION OF ELECTRIC MACHINES

[76] Inventors: Jean Parrier; Henri Parrier; André Parrier, all of Rue de la Sabliere, Saint-Genis les Ollieres (Rhone), France

[21] Appl. No.: 654,133

[22] Filed: Feb. 2, 1976

[30] Foreign Application Priority Data

Jan. 31, 1975 [FR] France ............... 75 03653

[51] Int. Cl.² ............................................. H02H 3/16
[52] U.S. Cl. ............................................. 361/42; 361/47; 361/49
[58] Field of Search .............. 317/18 R, 18 A, 18 D; 307/315, 316; 361/42, 41, 49, 48, 50

[56] References Cited

U.S. PATENT DOCUMENTS

| 2,663,806 | 12/1953 | Darlington | 307/315 |
| 2,698,416 | 12/1954 | Sherr | 307/316 X |
| 3,155,879 | 11/1964 | Casey et al. | 317/36 TD X |
| 3,239,718 | 3/1966 | Fegley | 317/18 R X |
| 3,286,129 | 11/1966 | Gagniere | 317/18 D |
| 3,402,326 | 9/1968 | Guasco et al. | 317/18 D |
| 3,487,284 | 12/1969 | Cady | 320/20 |
| 3,493,838 | 2/1970 | Gyugyi et al. | 323/22 SC |
| 3,581,152 | 5/1971 | Hunt | 317/18 R |
| 3,864,581 | 2/1975 | Satyanarayana | 317/18 D X |

FOREIGN PATENT DOCUMENTS

| 2,359,583 | 9/1974 | Fed. Rep. of Germany | 317/18 R |
| 453,585 | 5/1936 | United Kingdom | 317/18 D |
| 1,018,815 | 2/1966 | United Kingdom | 317/18 R |

Primary Examiner—Patrick R. Salce
Attorney, Agent, or Firm—Remy J. VanOphem

[57] ABSTRACT

The present invention relates to a security apparatus connected to the circuit of a machine in order to detect the presence of a fault therein such as a short circuit or loss of insulation between a power line and ground. The security apparatus comprises a tripping circuit having at least one transistor which is normally nonconductive and becomes conductive only when a fault current is fed to its base. The collector current activates a circuit breaking device and/or a signalling device which are continuously energized. The security apparatus operates, depending on its mode of connection, in response to a relatively small detected fault current resulting, for example, from defective insulation or from a short circuit. The security provided is irrespective of the state of the ground of the apparatus being protected.

6 Claims, 11 Drawing Figures

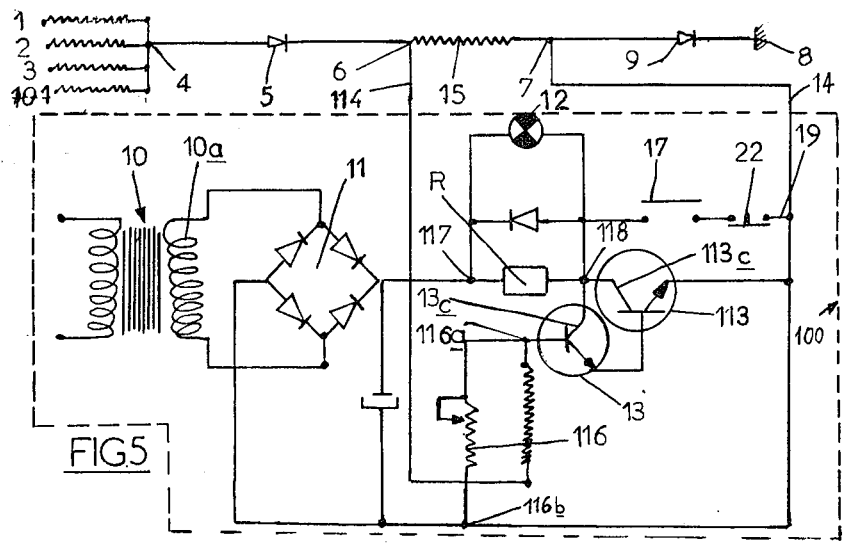
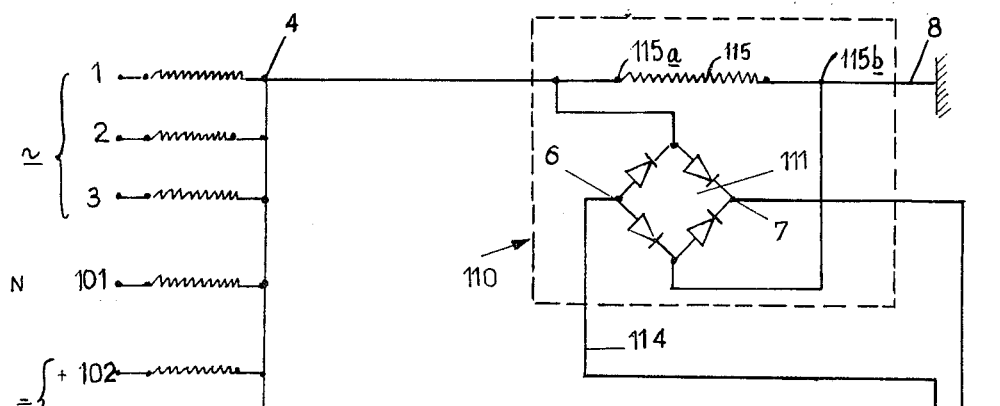
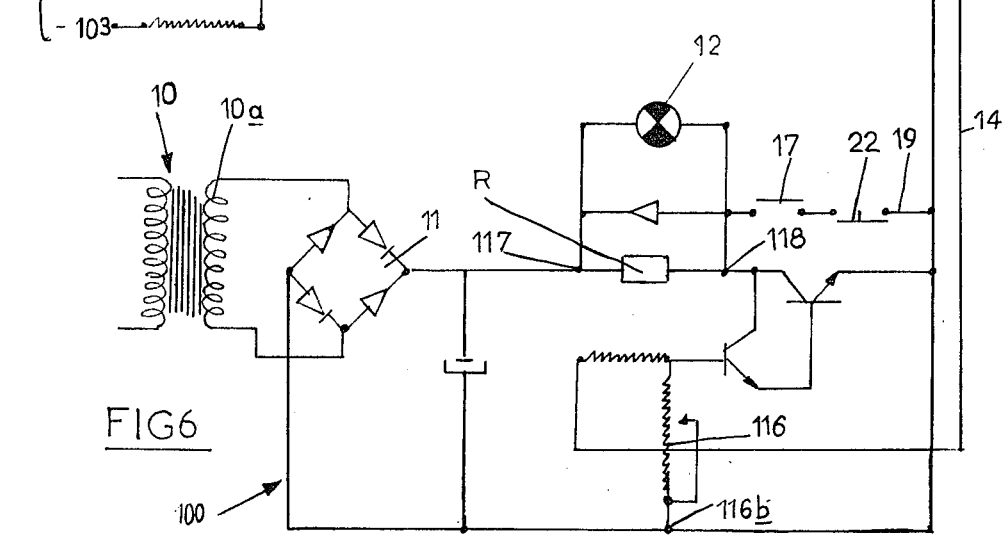

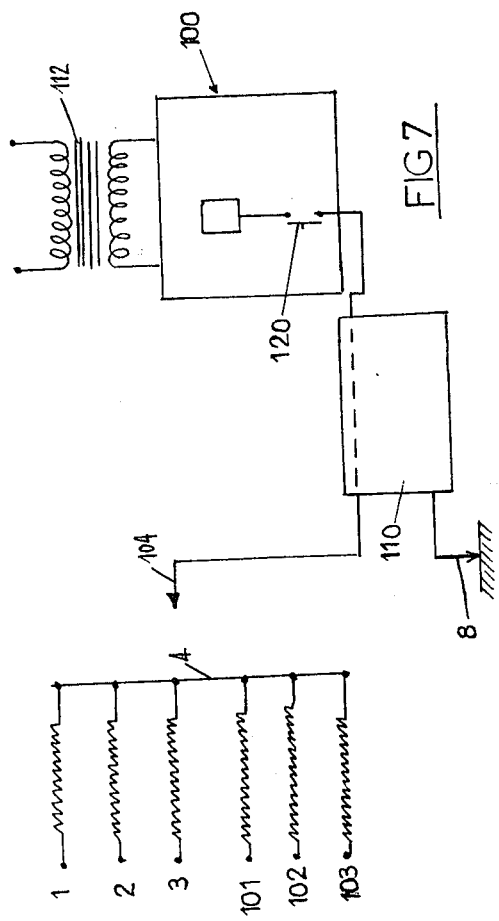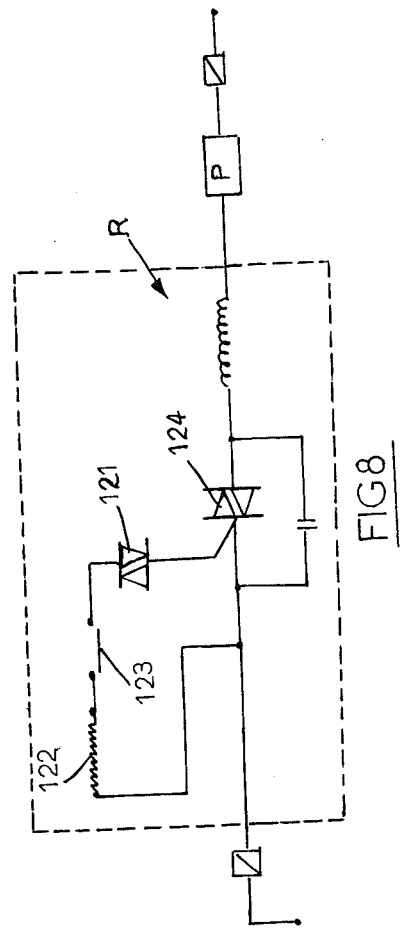

SECURITY APPARATUS FOR THE PROTECTION OF ELECTRIC MACHINES

BACKGROUND OF THE INVENTION

Various electric security devices are known. The known devices however, are relatively bulky and expensive. One type of such known security devices protects the security of all the machines in a shop. The problem with this type of device is that a single defective electric machine will cause the security device to stop all the machines in the shop, irrespective of whether they are defective or not. Other types of known security devices are connected between a power line and ground. But if the grounding wire itself becomes defective, then the fault will not be detected.

SUMMARY OF THE INVENTION

The security apparatus for detecting electric defects of an electric machine comprises a surveillance electric circuit which is continuously energized by a direct voltage. The surveillance circuit has a circuit breaker controlled by a tripping circuit which includes at least one transistor arranged to become conductive in response to a potential difference across a high-valued resistor mounted between the base and the emitter circuits of the transistor. The resistor has a value such that the base current is substantially equal to the short circit current which makes the transistor conduct. The transistor remains conducting for as long as the insulation defect remains.

BRIEF DESCRIPTION OF THE DRAWINGS

FIG. 5 is a schematic diagram of a modified embodiment of the security apparatus of this invention;

FIG. 6 illustrates the energization of the security apparatus of this invention by either AC or DC current;

FIG. 7 illustrates the use of the security apparatus of this invention for controlling an external auxiliary circuit;

FIG. 8 shows a different embodiment of the interrupter circuit in the security apparatus of this invention;

DETAILED DESCRIPTION OF PREFERRED EMBODIMENTS

Figure 1:
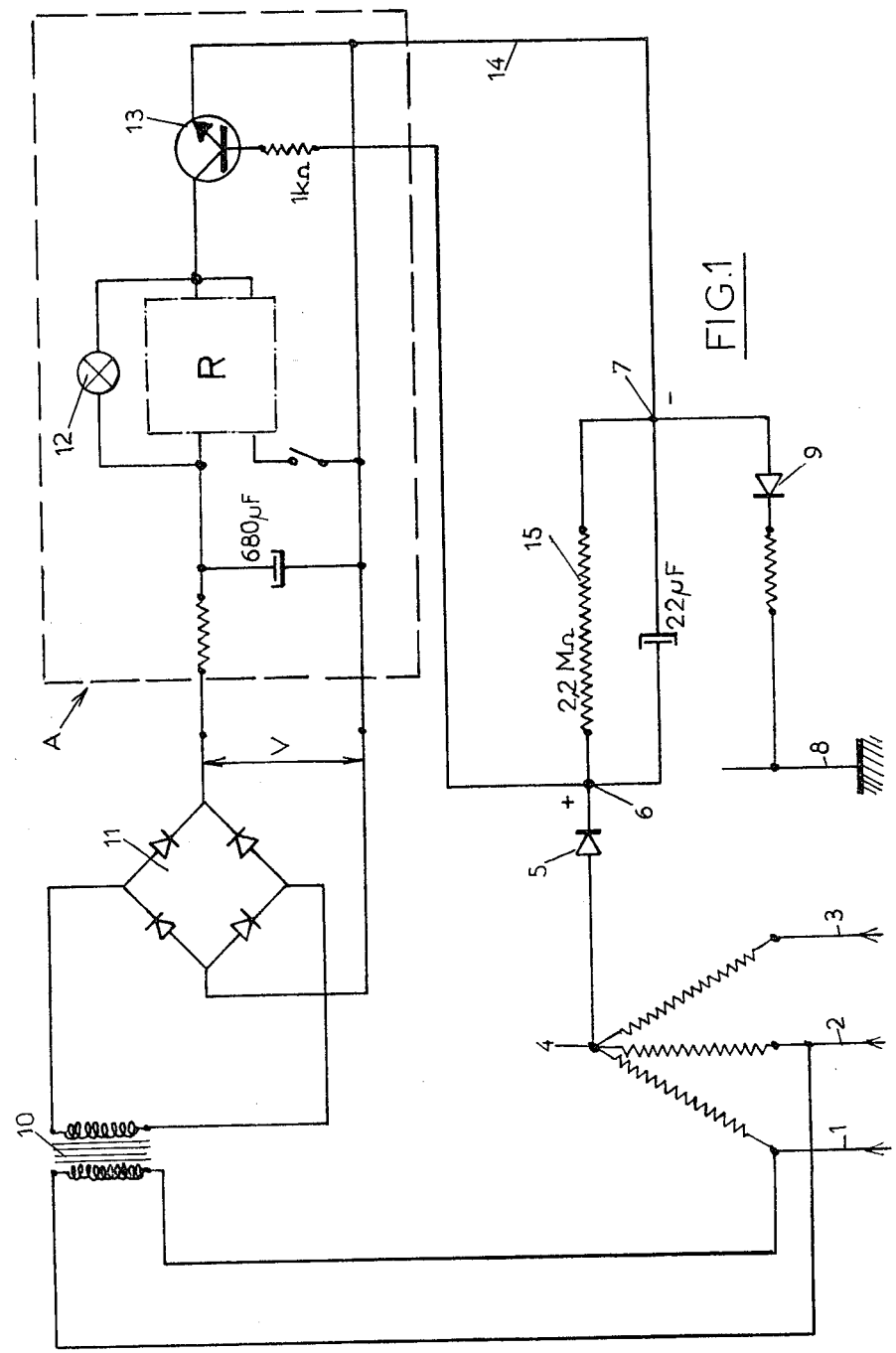
FIG. 1 is a circuit diagram of the security apparatus in accordance with this invention, shown connected between ground and the common point of a triphase electric machine.

In FIG. 1 is shown a triphase electric machine having a star formation whose common point 4 is connected through a diode 5 to a terminal 6. The grounding wire 8 is connected through a diode 9 to a terminal 7. The security apparatus, generally designated as A, of this invention detects the insulation faults which may occur between lines 1–3 and the ground line 8. The secondary winding of a transformer 10 provides a continuous surveillance voltage across a rectifier bridge 11. The constant DC output voltage V is applied to the input terminals of the apparatus A.

The security apparatus A itself comprises a power relay R across which is connected a signalling device 12 which may emit light, sound, etc. Also connected to the relay R is a base-collector and base-emitter circuits of a transistor 13. The base of transistor 13 is connected to terminal 6 while a line 14 connects the emitter to terminal 7. Between terminals 6 and 7 is connected a high-valued resistor 15.

Figure 2:
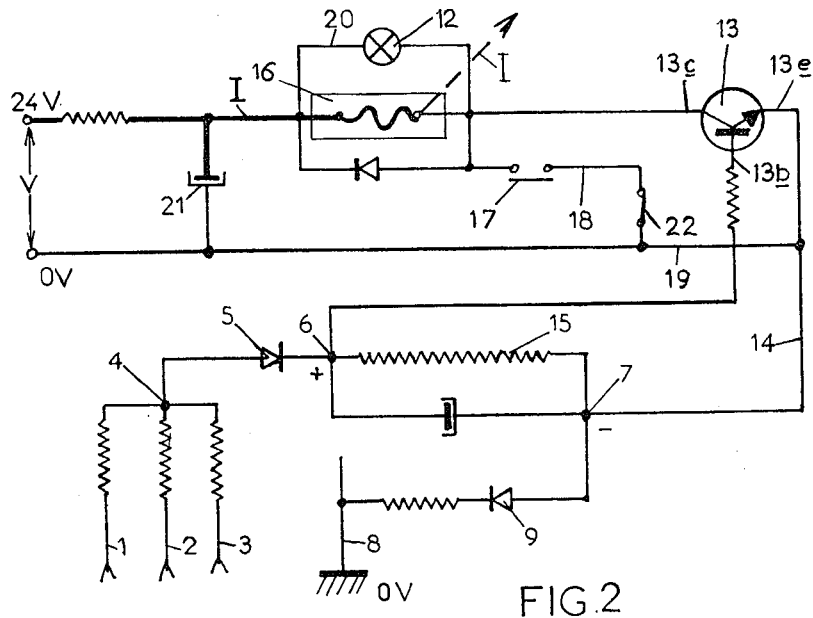
FIG. 2 shows in greater detail the interrupter circuit shown in FIG. 1.

FIG. 2 illustrates the condition of the security apparatus A and of the various components associated therewith when the power lines 1–3 are properly insulated from the ground line 8. Under these conditions, terminals 6 and 7 have no potential difference therebetween and hence no current will flow through diode 5. Transistor 13 is nonconducting since no current flows into the base 13b thereof, even though its collector 13c is energized through the relay coil 16. Accordingly no current will flow into the emitter 13e. The terminals 17 of relay 16 will be open, and no current will flow into lines 18 and 19. There is also provided an RC filter having a capacitor 21 of relatively large value (680 $\mu f$).

Figure 3:
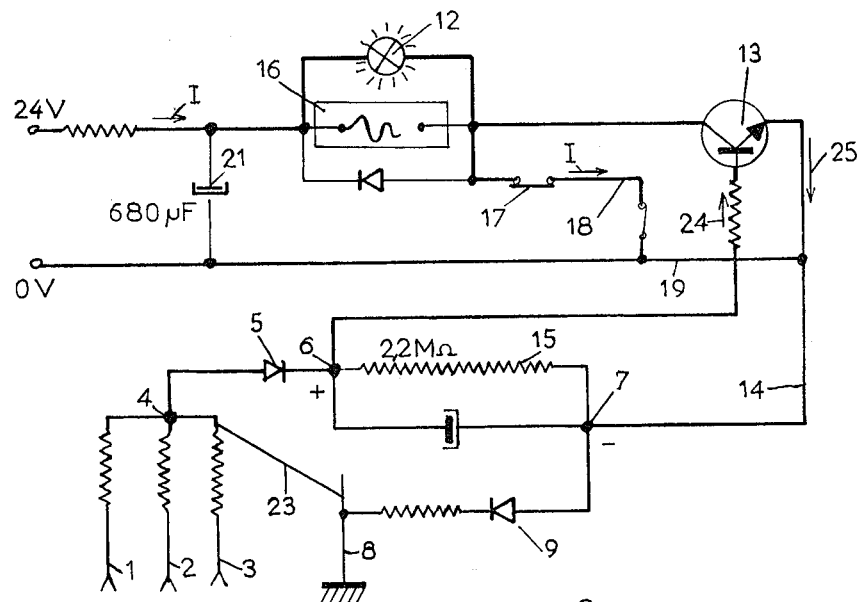
FIG. 3 is a view similar to FIG. 2 showing the security apparatus of this invention in its operating condition.

FIG. 3, which is similar to FIG. 2, illustrates the operative condition of the security apparatus of this invention. When a fault occurs it can be represented as a current path 23 between the common point 4 and the ground line 8. This current develops a potential across resistor 15 which creates a current flow 24 into the base 13b of transistor 13. If diodes 5 and 9 are properly polarized, transistor 13 will start conducting. As a result, current begins to flow into conductors 14, 18 and 19. Contacts 17 are closed by the relay 16. The energization of relay 16 also energizes the signalling device 12 which is shown as emitting light.

It is therefore apparent that when transistor 13 conducts, the emitter current 25 flows into lines 14 and 19. While a current I flows from the power circuit, a current of small intensity will flow through the transistor circuit. The current flowing through the transistor circuit is substantially equal to the current flowing through the short circuit 23. Resistor 15 and diodes 5 and 9 allow the polarization of the base of the transistor even when the machine being protected is not grounded. The security apparatus will begin to work even if the triggering current 24 is on the order of a few milliamperes.

Figure 4:
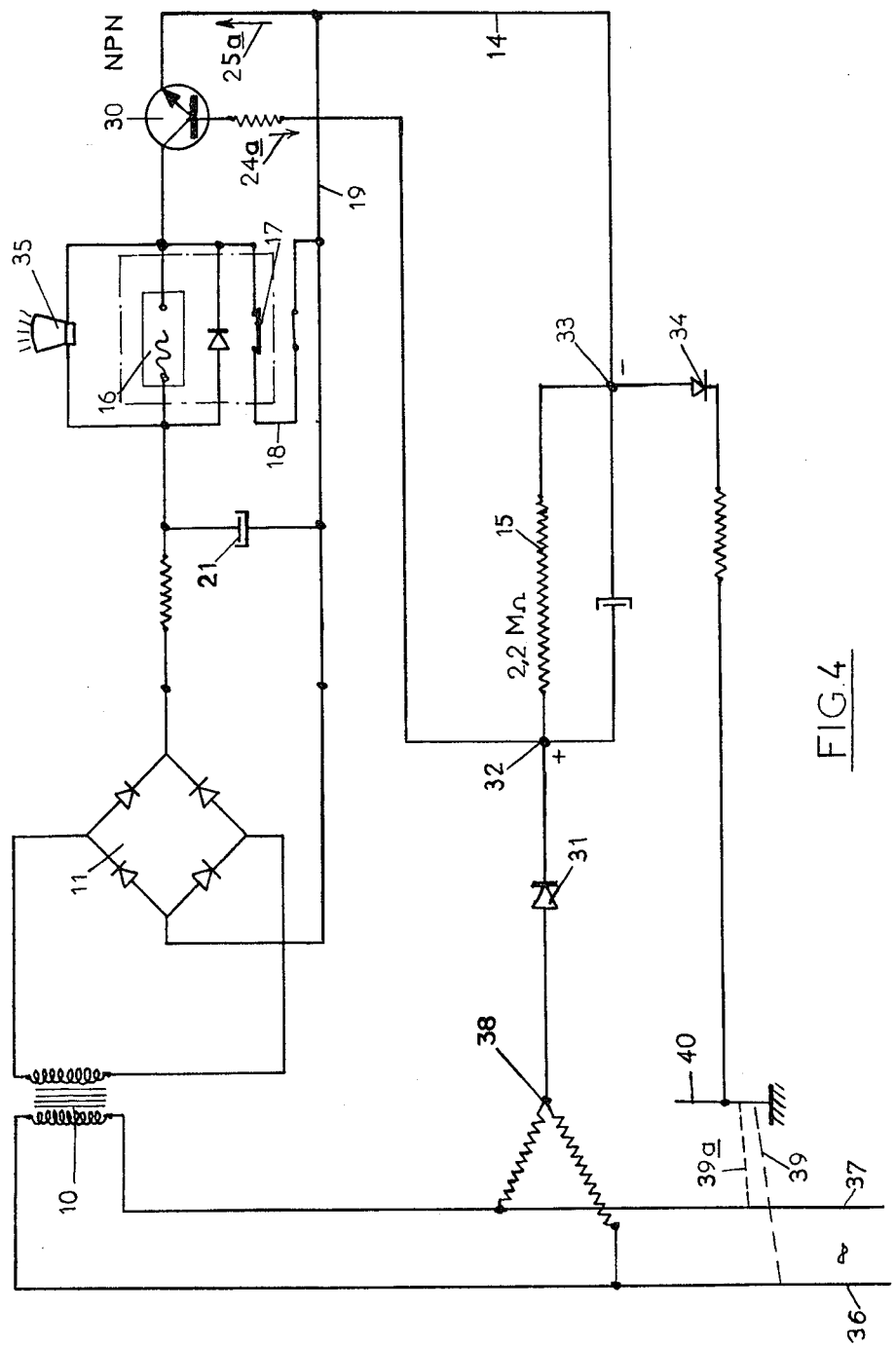
FIG. 4 illustrates the use of the security apparatus of this invention on a single-phase power circuit.

FIG. 4 shows the security apparatus A of this invention connected to an electric machine which is energized by a single phase main. The base circuit of transistor 30 is connected to the common point 38 through a diode 31. The emitter is connected to terminal 33 through line 14. Terminal 33 is connected through a diode 34 to the ground line 40. The transformer 10, energized by the single-phase power line, feeds the rectifying bridge 11 which provides the energizing surveillance voltage V to the security apparatus A of this invention. The signalling device 35 is a noise producing device. Faults manifest themselves by short circuits represented by 39, 39a, thereby producing a voltage at the common point 38. This voltage will produce a potential difference between terminals 32 and 33 which will make the transistor 30 conduct in a manner previously explained.

The essential advantages of the invention are the following: a fault can be detected even if the machine is not grounded; the relatively small current required to trigger the security apparatus of this invention makes the apparatus economical to connect for supervising each machine of a multi-machine shop. The value of resistor 15 is selected so that the intensity of the current flowing into the base of the transistor becomes substantially equal to the polarized current delivered by diodes 5 and 9 in FIGS. 2 and 3 or by diodes 31 and 34 in FIG. 4. Accordingly, the machine whose fault is detected can be de-energized as soon as a fault current is detected on the order of a few milliamperes.

A modification of the security apparatus of this invention is shown in FIG. 5 wherein the tripping relay circuit comprises an amplifier having two transistors 13 and 113. An adjustable potentiometer 116 is disposed between the base circuit of the first transistor 13 and the emitter circuit of the second transistor 113. A common terminal 101 may be connected to the common terminal 4 of the power main. The voltage at terminal 6 is applied to the base of the first transistor. The emitter of the second transistor 113 is connected by line 14 to the opposite terminal 7. Between terminals 6 and 7 is connected the high-valued resistor 15. The collectors 13c and 113c have a common junction 118 which constitutes one input terminal to the tripping relay R. The other terminal 117 of relay R receives the energization or surveillance DC voltage V from the rectifier bridge 11.

In operation of the embodiment of FIG. 5, as soon as a potential difference develops across resistor 15 it becomes applied across the terminals of the potentiometer 116. Current starts flowing into the base of transistor 13 which makes transistors 13 and 113 conduct. The base current can be adjusted to a desired threshold value by the setting on potentiometer 116. The security or surveillance apparatus produces a warning signal through device 12 connected in parallel with relay R, as previously explained.

A modification of the invention is shown in FIG. 6. The surveillance apparatus itself is not modified but only the mode of connecting the security apparatus to the electric machine to be supervised is modified. Lines 14 and 114 are connected to the opposite terminals of a rectifying bridge 111 which is connected in parallel across terminals 115a, 115b between which is also connected a high-valued resistor 115. Terminal 115a is directly connected to the common point 4 while terminal 115b is connected to the ground line 8. This arrangement allows the security apparatus of this invention to become universal, that is, capable of supervising electric machines energized by DC and polyphase AC including single-phase and triphase, having high, medium or low voltage intensity.

This construction is utilized, for example, to control an external circuit 112 (FIG. 7) in which the surveillance apparatus of the invention 100 is coupled to the output of a circuit 110 having an input terminal connected to ground 8 and another terminal 104 coupled by an intermediate contact 120 to one of the power lines 1, 2, 3, 101, 102, & 103, having a common point 4.

FIG. 8 shows a modified arrangement of the relay R. A diac 121 is energized through a resistor 122. A switch 123 controls the opening and closing of this circuit. This electronic element controls a triac 124 connected to the diac 121 and to the power circuit. When a fault occurs, the diac 121 causes the triac 124 to open and the rupture of the energization of the utilization device P.

Figure 9:
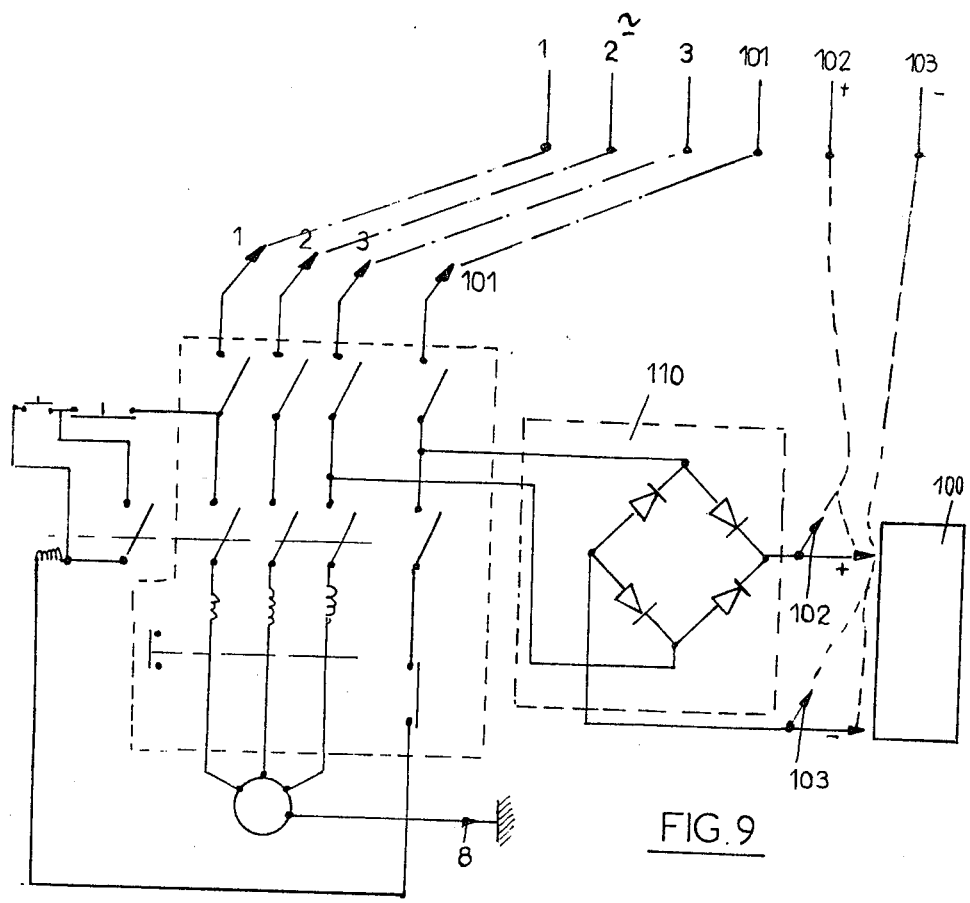
FIG. 9 is a circuit diagram of a tripping relay associated with the interrupter circuit of the security apparatus of this invention.

FIG. 9 shows in detail another arrangement for the relay R in connection with a control and detection apparatus which allows, after establishing ground, to verify the proper insulation of each of the power lines 1, 2, 3, 101, 102 and 103, the ground 8 need not be connected to the earth.

Figure 10:
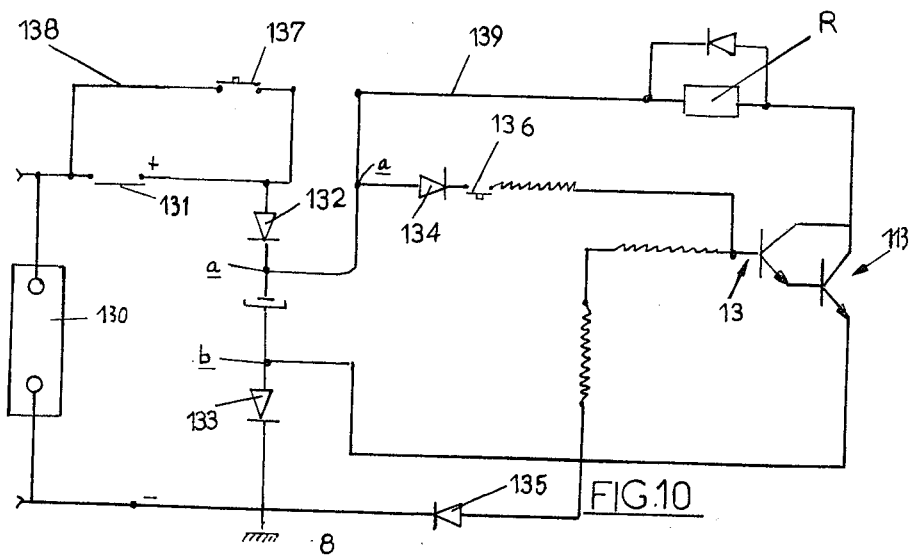
FIG. 10 illustrates a simplified embodiment of the security apparatus connected for protecting the battery circuit of an automobile.

The security apparatus in accordance with this invention can equally well be adapted for supervising the battery circuit of an automobile. The energizing surveillance voltage previously derived from a transformer can now be directly provided by the battery 130 (FIG. 10). This voltage is applied across the relay R having terminals 131 connected to suitably polarized diodes 132, 133, 134 and 135. When the RPM of the automobile engine change rapidly as during acceleration or deceleration, it is known that a momentary unbalance will appear between terminals a and b. The same happens when the engine is started. In order to prevent the surveillance apparatus from causing a power failure, there is provided means which will break power only when the short circuit or the fault of insulation is lasting. There is also provided a power loop containing contacts 131 and contacts 137.

In operation, in order to start the engine, one maintains open a third contact 136. The current flows on one hand through the loop 138 on which contacts 131 and 137 are closed, and on the other hand, through diode 132 and line 139. This current feeds the relay R while the engine is started. After the engine starts, one releases contact 136 which will again close but only when a fault will occur between points a and b. A lasting fault of insulation at points a or b, or between them, will release a current between the defective point and ground. The base circuit closes through contact 136 and a base current flows through diode 134 or 135 to transistors 13 and 113 which become conductive. The transistor current flows through relay R and through contacts 136 so that the two posts of battery 130 become grounded. The contacts 131 of the battery circuit open and its energization becomes interrupted. The substantially instantaneous triggering of an alarm through the relay R will take place whereas the opening of the contacts 131 takes place only after a suitable delay, due for example, to the response time of contacts 131, 136 and 137. This delay avoids the triggering of the apparatus resulting from an imbalance produced by a transient condition while insuring at the same time a permanent surveillance of the engine of the vehicle.

Under all conditions, it is possible to regulate the sensitivity of the apparatus in such a fashion that it cannot trigger prematurely causing the rupture of the energizing power when the engine accelerates or decelerates.

In a similar fashion, the universal apparatus shown in FIG. 6 can be utilized on board an aircraft. The apparatus is not connected to the earth and the electronic and electric networks will not be deprived brutally of energizing power. A defect of insulation will produce an alarm which will allow the crew to correct the defect before it becomes dangerous.

Figure 11:
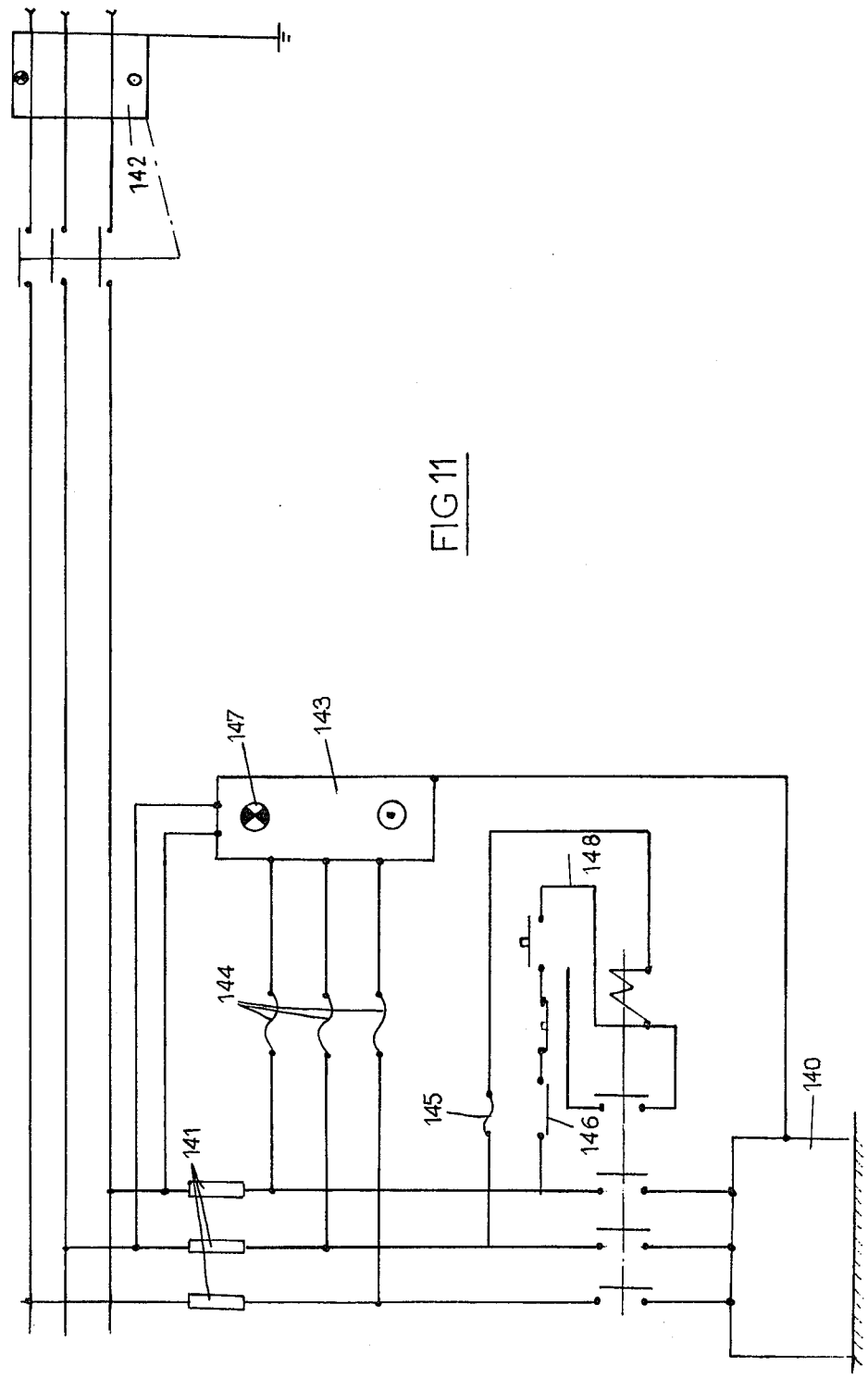
FIG. 11 illustrates the security apparatus connected to protect a machine energized by high current.

In FIG. 11 is shown another embodiment especially suitable to electric motors operating under large current for example between 10 to several hundred amperes. Each motor 140 is protected by power fuses or circuit breakers 141 as well as by an individual security apparatus 142. The circuit breakers 141 are designed to protect the machine in the event of a complete short circuit, for example, between two phase lines. But these circuit breakers do not become operative if the short circuit is only partial. It is possible in this manner to have a short circuit on the order of 5 to 10 amperes. While the machine is suitably protected by the circuit breakers, the operator of the machine is dangerously exposed to electrocution. The security apparatus 143 protects the operator. Current $I_1$ is supplied by the circuit of the machine through fuses 144 which melt for example when traversed by a current on the order of 100 ma. When a fault is not detected, the current in the fuses 144 is zero. The electric machine operates normally and the security apparatus 143 is in its rest condition.

A short circuit, for example between two phases or between one phase and ground, creates a current through the fuses 144 flowing in the direction of the apparatus 143. As soon as this current becomes dangerous, fuses 144 and 145 melt which triggers the opening of the circuit breaker 146 of the power circuit 148, thereby rupturing the power to the machine and triggering the alarm 147. The operator is in this fashion protected against all electric faults. Whereas the power circuit breakers 141 are designed as a function of the power of the machine, the fuses of security 144 are independent of the power of the machine and have as their sole object the protection of the operator.

What is claimed is:

1. A security circuit for detecting an electrical defect of a machine under supervision comprising:
   latch circuit means for generating an output signal in response to an input signal, said latch circuit means having an initial state not generating said output signal and switchable to a latched state generating said output signal in response to said input signal;
   semiconductor circuit means in circuit relationship with said latch circuit means for generating said input signal in response to a fault signal indicative of an electrical defect of the machine;
   fault signal generating means in circuit relationship with the machine for generating said fault current in response to an electrical defect of said machine, said fault signal generating means including a polarized high resistance having one end connected to ground to bias said fault signal with respect to ground.

2. The apparatus of claim 1 wherein said semiconductor circuit means includes at least one transistor having a collector connected to said latch circuit means, an emitter connected to said ground and a base and wherein said high resistance is connected between said base and said ground, and said input signal is a current flow from the collector to the emitter of said transistor.

3. The apparatus of claim 1 wherein said latch circuit means includes a latching relay having a coil energizing a normally open switch to connect the output end of said relay coil to said ground and the ground signal at the output end of said relay coil is said output signal.

4. The apparatus of claim 1 wherein said latch circuit means is a semiconductor latching circuit.

5. The apparatus of claim 1 further including an alarm network energized in response to said output signal.

6. The apparatus of claim 1 wherein said semiconductor circuit means includes a first and a second transistor, the base of said first transistor connected to ground and the emitter of the second transistor through an adjustable potentiometer; the emitter of the first transistor is connected to the base of the second transistor and the collectors of said first and second transistors are connected together as well as to said latch circuit means.

* * * * *